United States Patent
Shin et al.

(10) Patent No.: US 7,403,276 B2
(45) Date of Patent: Jul. 22, 2008

(54) PHOTOMASK FOR MEASURING LENS ABERRATION, METHOD OF ITS MANUFACTURE, AND METHOD OF ITS USE

(75) Inventors: Jang-Ho Shin, Seoul (KR); Han-Ku Cho, Gyeonggi-do (KR); Sang-Gyun Woo, Gyeonggi-do (KR); Suk-Joo Lee, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 330 days.

(21) Appl. No.: 11/388,887

(22) Filed: Mar. 23, 2006

(65) Prior Publication Data
US 2006/0216616 A1    Sep. 28, 2006

(30) Foreign Application Priority Data
Mar. 23, 2005    (KR) .................. 10-2005-0024074

(51) Int. Cl.
*G01B 9/00*    (2006.01)
(52) U.S. Cl. ........................... 356/124; 430/5
(58) Field of Classification Search .................. 356/124
See application file for complete search history.

(56) References Cited

U.S. PATENT DOCUMENTS 6,913,858 B2 *   7/2005   Kim ............................... 430/5

2003/0193656 A1 *  10/2003  Kim ............................. 355/67
2004/0214095 A1 *  10/2004  Nakao .......................... 430/5
2006/0121368 A1 *   6/2006  Wu ............................... 430/5

FOREIGN PATENT DOCUMENTS

JP    2003-156832    5/2003
KR    2003-0085896   11/2003

OTHER PUBLICATIONS

English language abstract of Korean Publication No. 2003-0085896.
English language abstract of Japanese Publication No. 2003-156832.

* cited by examiner

*Primary Examiner*—Roy M Punnoose
(74) *Attorney, Agent, or Firm*—Marger Johnson & McCollom, P.C.

(57) ABSTRACT

A photomask for measuring lens aberration, a method of manufacturing the photomask, and a method of measuring lens aberration using the photomask are provided. In an embodiment, the photomask includes a transparent substrate having first and second surfaces. A reference pattern group and an encoded pattern group are formed on the second surface of the transparent substrate, spaced apart from each other. An aperture that includes a Fresnel zone is formed to face the second surface on the second surface of the transparent substrate. Light throughput and measurement efficiency are improved.

28 Claims, 9 Drawing Sheets

PHOTOMASK FOR MEASURING LENS ABERRATION, METHOD OF ITS MANUFACTURE, AND METHOD OF ITS USE

CROSS-REFERENCE TO RELATED PATENT APPLICATION

This application claims the benefit of Korean Patent Application No. 10-2005-0024074, filed on Mar. 23, 2005, in the Korean Intellectual Property Office, the disclosure of which is incorporated herein in its entirety by reference.

BACKGROUND

1. Field of the Invention

The present invention relates to a photomask, and more particularly, to a photomask for measuring lens aberration, a method of manufacturing the photomask, and a method of measuring lens aberration using the photomask.

2. Description of the Related Art

Circuit patterns that constitute a semiconductor device or a display device are formed by photolithography in an exposing apparatus. The exposure apparatus forms a circuit pattern on a wafer by radiating light onto a photomask. The exposure apparatus has an optical system that includes a lens to project the shape of a reduced shielding pattern of the photomask by collecting light on a surface of the wafer.

However, the lens in the optical system generally has an aberration that causes an imperfect focus on the wafer. The lens aberration may change the location of a circuit pattern on a wafer, which may cause various problems, such as a short-circuit on a highly integrated semiconductor device, which may have little or no space margin. Therefore, it is important to measure the lens aberration before performing a photolithography process to form a circuit pattern. Various methods for measuring the lens aberration have been proposed.

The prevailing method of measuring the lens aberration is to measure the magnitude of variation of an overlay value after measuring the overlay values using a lens aberration measuring photomask having a shielding pattern. More specifically, as depicted in FIG. 1, a wafer 40, on which a photoresist film 45 is formed, is loaded into an exposure apparatus (not shown) that includes an optical system composed of lenses 32 and 33 that are to be measured. Next, a reference photoresist pattern 46 is formed on the wafer by radiating light 50 onto a first photomask 10 after aligning the first photomask 10 on which a reference pattern 12 is formed. Afterward, an encoded photoresist pattern 47 is formed on the wafer 40 by irradiating light onto a second photomask 20 after replacing the first photomask 10 with the second photomask 20 on which an encoded pattern 22 is formed.

Next, an overlay value is obtained by measuring the distances ×1 and ×2 between the reference photoresist pattern 46 and the encoded photoresist pattern 47, and the lens aberration is measured based on the overlay value.

At this time, an aperture 15 is included to verify the lens aberration at a specific region of a lens pupil between the photomask 10 or 20 and a lens 30. The aperture 15 includes at least one pin hole 17 for confining the angle of light irradiated onto the lens 30.

Also, the wafer 40 must be located outside the optimal focus F to form a plurality of reference patterns 12 and encoded patterns 22 on predetermined regions on the wafer 40.

However, the above method of measuring lens aberration requires two photomasks 10 and 20. Therefore, it takes time to replace the first photomask 10 with the second photomask 20, thereby increasing the overall process time.

Also, an additional aligning process is required whenever the first photomask 10 is replaced with the second photomask 20. Furthermore, if the second photomask 20 is misaligned, an overlay variation may occur regardless of the lens aberration, which makes the correct measurement of lens aberration difficult.

Also, a high exposure energy of several J/cm$^2$ is required to form the photoresist patterns 46 and 47, using a light source having, for example, a wavelength of 248 nm or 193 nm, since the light irradiated through the photomasks 10 and 20 is transferred to the photoresist film 45 through a small pin hole having a diameter of a few tens of μm in the aperture 15 or 25, thereby reducing the exposure efficiency. For reference, an exposure energy required for forming a photoresist pattern is generally 20-30 mJ/cm$^2$.

SUMMARY

Some embodiments of the present invention provide a photomask for measuring lens aberration, which can reduce photomask replacement time and improve exposure efficiency.

Some embodiments of the present invention also provide a method of manufacturing the photomask and a method of measuring lens aberration using the photomask.

According to an aspect of the present invention, a photomask for measuring a lens aberration may comprise: a transparent substrate having a first surface and a second surface; a reference pattern group formed on the second surface of the transparent substrate; an encoded pattern group formed on the second surface of the transparent substrate and spaced apart from the reference pattern group; and an aperture formed to face the second surface of the transparent substrate and including a plurality of ring shaped openings arranged in a concentric circle shape.

According to another aspect of the present invention, a method of manufacturing a photomask for measuring lens aberration may comprise: providing a transparent substrate having first and second surfaces; forming a shielding film on the second surface of the transparent substrate; forming a reference pattern group and an encoded pattern group on the second surface of the transparent substrate by patterning the shielding film; and forming an aperture facing the second surface of the transparent substrate.

According to yet another aspect of the present invention, a method of measuring lens aberration may comprise: providing a photomask that includes a transparent substrate having a first surface and a second surface, a reference pattern group and an encoded pattern group spaced apart from each other on the second surface of the transparent substrate, and Fresnel lens shaped openings that face the second surface of the transparent substrate; locating the photomask in an exposure apparatus so that the first surface of the transparent substrate faces a light source of the exposure apparatus and an aperture faces optical lenses of which the lens aberration will be measured; forming a reference photoresist pattern (or an encoded photoresist pattern) by exposing a photoresist film on a wafer loaded on the exposure apparatus using the photomask; shifting the photomask to locate the encoded pattern group on a region where the reference pattern group is located; forming an encoded photoresist pattern (or a reference photoresist pattern) by exposing the photoresist film on the wafer using the shifted photomask; and measuring lens aberration on a pupil plane of the optical lens based on the distance between the reference photoresist pattern and the encoded photoresist pattern.

BRIEF DESCRIPTION OF THE DRAWINGS

The above and other features and advantages of the present invention will become more apparent by describing in detail exemplary embodiments with reference to the attached drawings in which.

DETAILED DESCRIPTION

Figure 1:
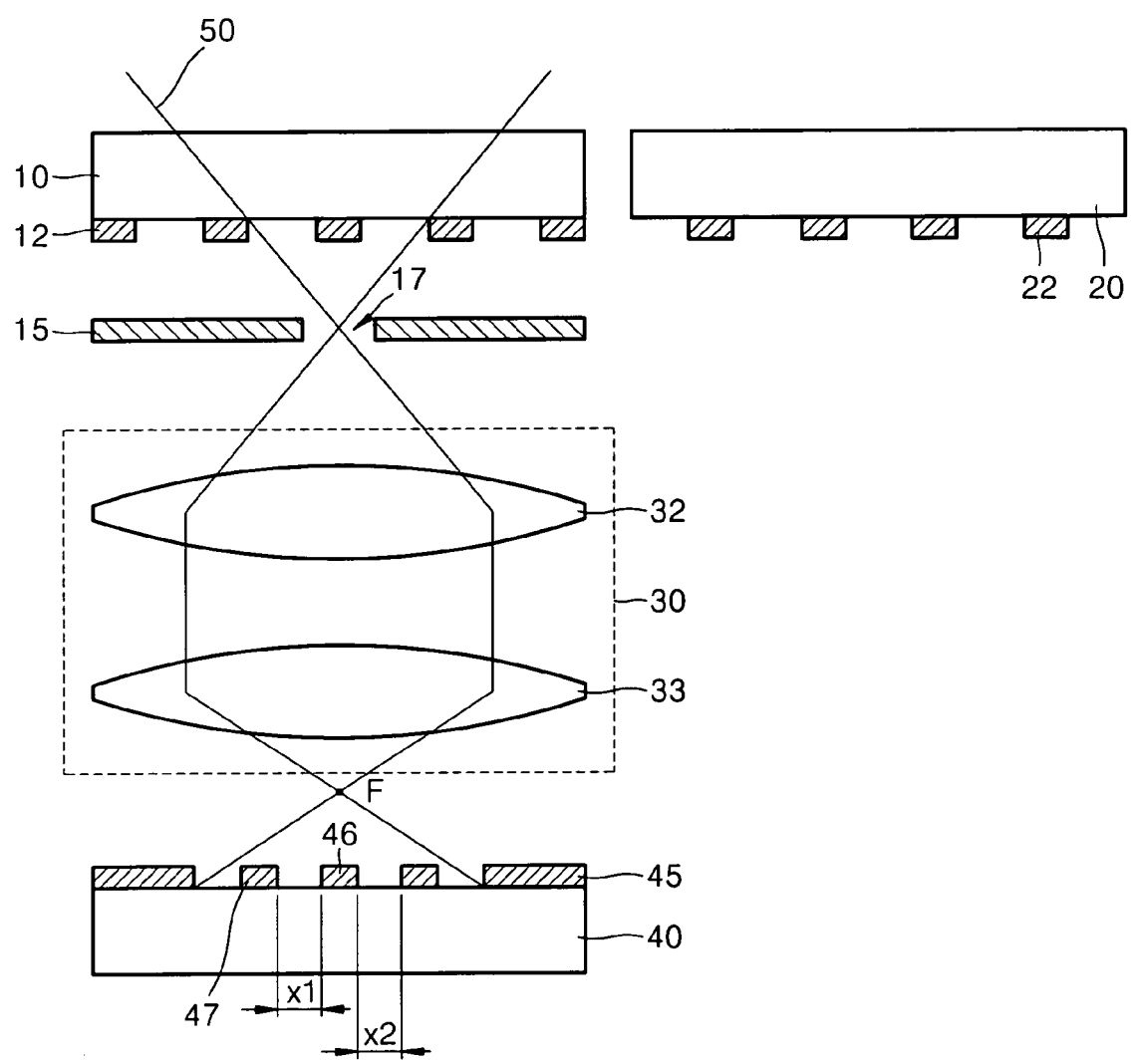
FIG. 1 is a cross-sectional view illustrating a conventional method of measuring lens aberration.

The present invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art. In the drawings, the shapes of elements are exaggerated for clarity, and like reference numerals refer to like elements throughout the drawings.

An aspect of the present invention is that an exposure process is performed without replacing a photomask, by integrating a plurality of reference patterns and encoded patterns on one photomask. Another aspect of the present invention is that an aperture has a Fresnel zone pattern or a Fresnel zone opening. The Fresnel zone pattern can improve exposure efficiency by reducing the needed exposure dose, since the Fresnel zone pattern has a high light integration capability. Also, yet another aspect of the present invention is that the aperture is located at a distance from a reference pattern and an encoded pattern. To measure lens aberration, a wafer must be intentionally located outside of the optimal focus. However, in the present invention, the lens aberration may be measured without moving the wafer, by controlling the location of the aperture. A lens aberration measuring photomask having the above aspects will now be described more in detail.

Figure 2:
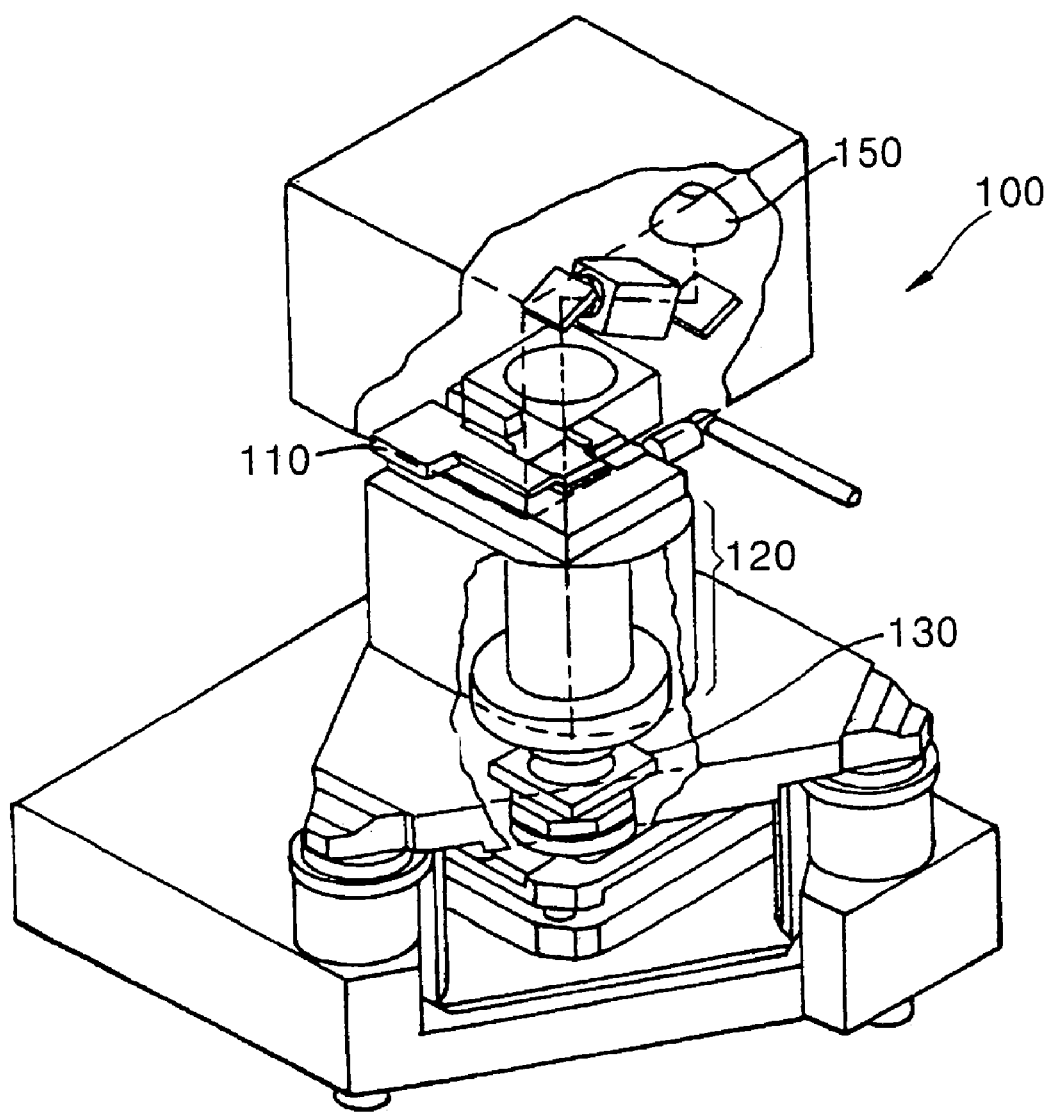
FIG. 2 is a cutaway perspective view of an exemplary exposure apparatus to be used in some embodiments of the present invention.

An exposure apparatus 100, such as a stepper as depicted in FIG. 2, for performing a photolithography process, comprises a mask table 110 on which a photomask is mounted, an optical system 120 having an object lens, and a wafer table 130 on which a wafer will be loaded. The exposure apparatus 100 can further comprise elements for extremely precise alignment of the photomask.

Figure 3:
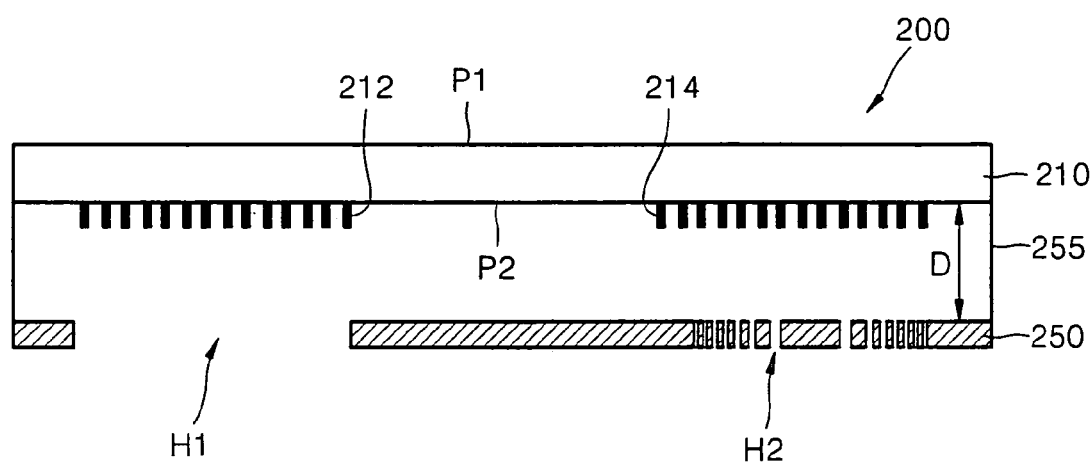
FIG. 3 is a cross-sectional view illustrating a photomask according to an embodiment of the present invention.

As depicted in FIG. 3, a photomask 200 according to an embodiment of the present invention, which will be mounted on the mask table 110 of the exposure apparatus 100, comprises a transparent substrate 210 having a first surface P1 and a second surface P2, and an aperture 250 mounted on the second surface P2 of the transparent substrate 210. The transparent substrate 210 may be formed of quartz.

Figure 4:
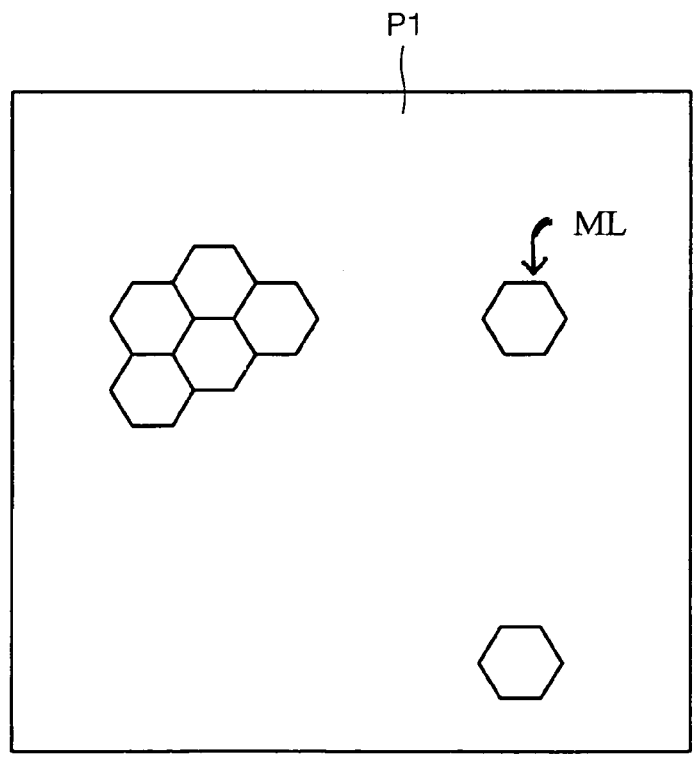
FIG. 4 is a plan view showing a first surface of a photomask according to an embodiment of the present invention.

As depicted in FIG. 4, a plurality of micro lenses ML are arranged on the transparent substrate 210. The micro lenses ML collect light from various angles. That is, the micro lenses ML improve the uniformity of incident light by even collecting light incident on the sides of the transparent substrate 210. The micro lenses ML can be rectangular, polygonal, or, as shown in FIG. 4, hexagonal. The first surface P1 of the transparent substrate 210 can realize illumination matching optic (IMO) by the arrangement of the micro lenses ML.

Figure 5:
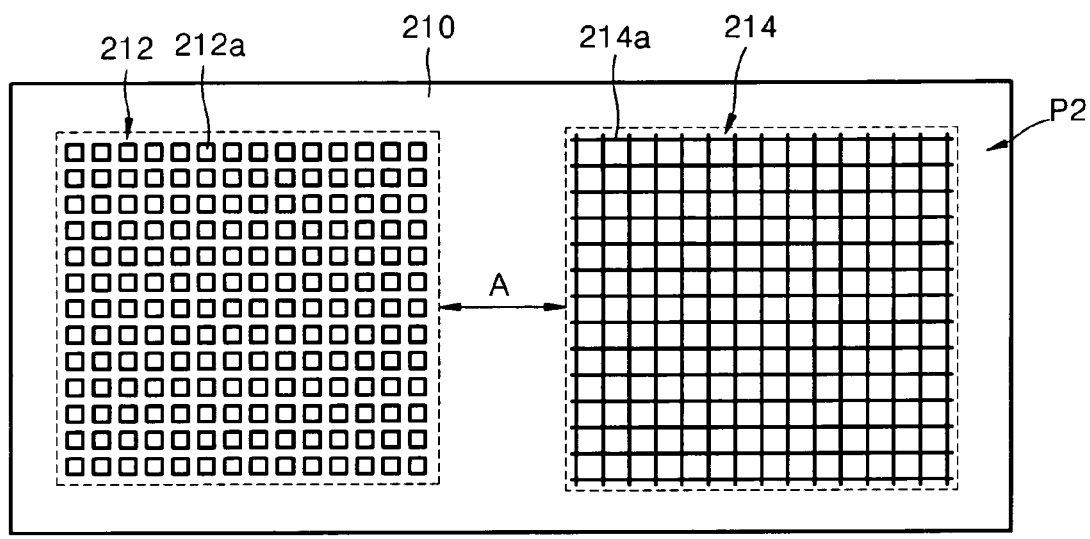
FIG. 5 is a plan view showing a second surface of the photomask according to an embodiment of the present invention.

As depicted in FIG. 5, a reference pattern group 212 and an encoded pattern group 214 for measuring lens aberration are formed at the same time on the second surface P2 of the transparent substrate 210. The reference pattern group 212 may be composed of a plurality of square patterns 212a arranged in a matrix, and the encoded pattern group 214 may be composed of a grid pattern 214a that defines a plurality of rectangular regions. The rectangular regions defined by the grid pattern 214a have a size that can accommodate the square pattern 212a. The reference pattern group 212 and the encoded pattern group 214 may be formed by forming a shielding film on the second surface P2 of the transparent substrate 210 and patterning the shielding film. The shielding film may be formed of chromium Cr.

Figure 6:
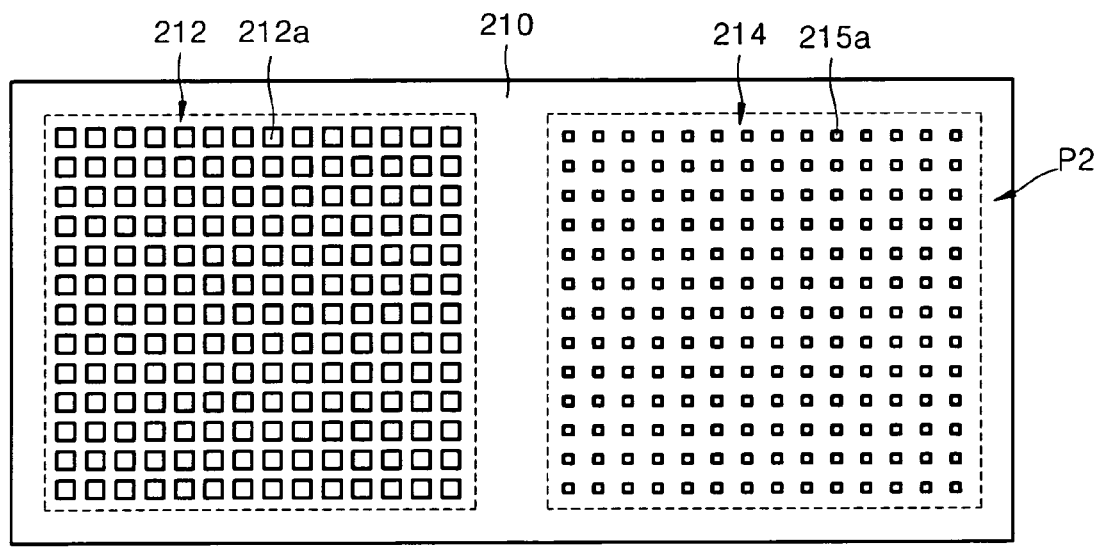
FIG. 6 is a plan view showing a second surface of a photomask according to another embodiment of the present invention.

As depicted in FIG. 6, the encoded pattern group 214 may also be composed of a plurality of square patterns 215a. The square patterns 215a that constitute the encoded pattern group 214 may be a reduced shape of the square pattern 212a of the reference pattern 212.

Both the reference pattern group 212 and the encoded pattern group 214 are formed on one sheet of the transparent substrate 210, and the reference pattern 212 and the encoded pattern group 214 may be arranged alternately at a spacing of about 100 to about 900 um. That is, the reference pattern group 212 and the encoded pattern group 214 can be formed on a blank transparent substrate 210 on which no other patterns are formed.

Figure 7:
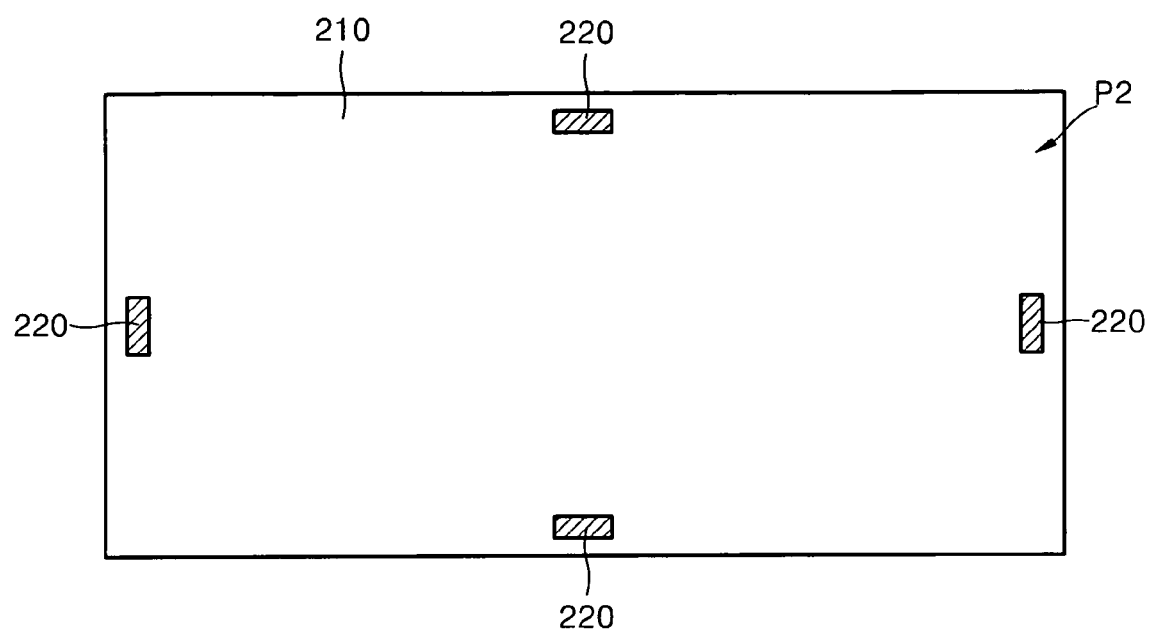
FIG. 7 is a schematic drawing of a second surface of a photomask on which alignment marks according to an embodiment of the present invention are formed.

As depicted in FIG. 7, alignment marks 220 can be formed on the edges of the second surface P2 of the transparent substrate 210. The alignment marks 220 can be formed simultaneously with the reference pattern group 212 and the encoded pattern group 214. The alignment marks 220 align photoresist patterns formed by the reference pattern group 212 with the photomask 200 of the encoded pattern group 214 when the photomask 200 is shifted.

Figure 8:
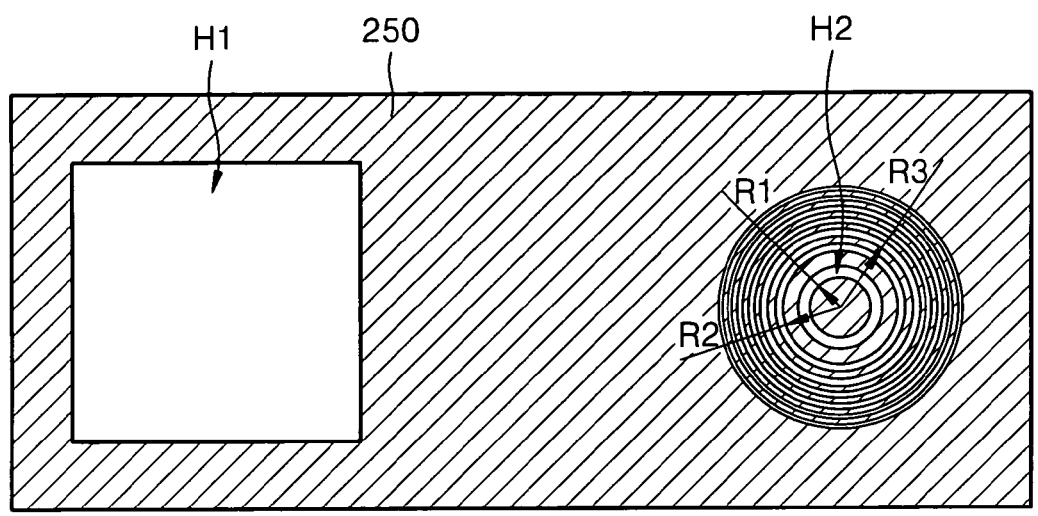
FIG. 8 is a plan view of an aperture according to an embodiment of the present invention.

The aperture 250 is mounted to face the second surface P2 of the transparent substrate 210. The aperture 250 may be mounted in one body with the transparent substrate 210 by a connection member 255. As depicted in FIG. 8, the aperture 250 includes a square shaped opening H1 and a Fresnel zone opening H2 or a Fresnel lens shaped opening. The square shaped opening H1 is arranged corresponding to the reference pattern group 212, and has a size that can accommodate the reference pattern group 212. The overall size of the Fresnel zone opening H2 is approximately the same as the encoded pattern group 214. The Fresnel zone opening H2 has a set focus length, and is composed of a plurality of ring shaped openings arranged in concentric circles.

The ring radius Rm of each Fresnel zone opening H2 is defined by the following equation.

$$Rm \approx \sqrt{m \times f \times \lambda}$$

where m is an integer, f denotes the focal length of the Fresnel lens, and λ represents the wavelength of incident light.

The ring shaped openings improve the diffraction characteristics of incident light, because the gaps between the ring shaped openings decrease as the radius of the ring shaped openings increase. Accordingly, the exposure efficiency is improved by improving the contrast of incident light. Also, each radius of the consecutive ring shaped Fresnel zone openings H2 controls the distance of an optical path from the openings H2 to the focal point to increase λ/2 times for each ring is added.

For example, if the focal length f is 10 μm and the wavelength of the incident light is 193 nm, the radius R1 of a first ring of a Fresnel zone opening H2 is 1.3892 μm, the radius R2 of the second ring is 1.9647 μm, and the radius R3 of the third ring is 2.4062 μm. The exposure energy can be improved more than tenfold by using Fresnel lens shaped openings.

Also, the aperture 250, according to an embodiment of the present invention, can be formed a distance D, for example 200-500 μm, from the second surface of the transparent substrate 210. An image must be detected substantially outside the optimal focus to measure lens aberration. Therefore, in the conventional art, an exposure process is performed after moving the wafer outside the optimal focus. However, in the present invention, the wafer can be located outside the optimal focus without moving the wafer, by locating the aperture 250 a distance D from the transparent substrate 210.

Figure 9:
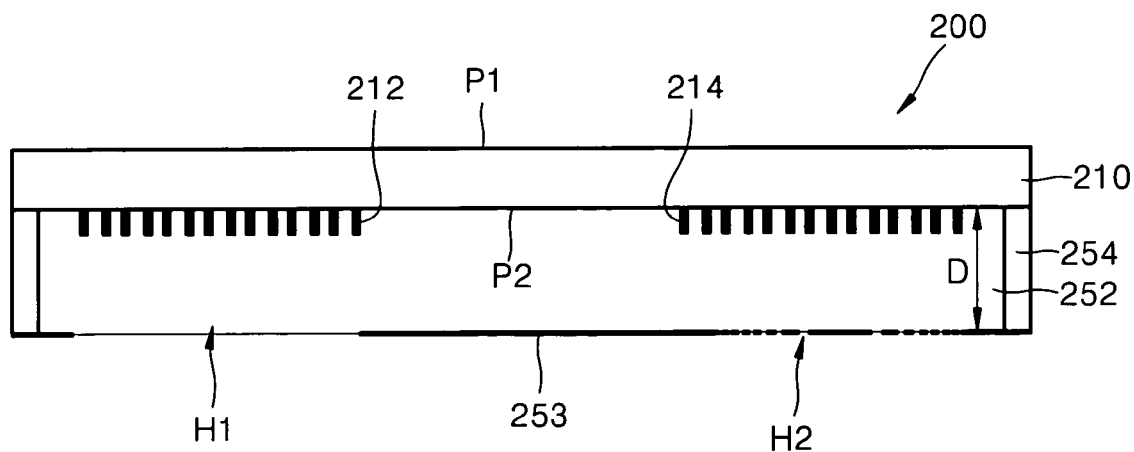
FIG. 9 is a cross-sectional view illustrating a photomask according to another embodiment of the present invention.

As depicted in FIG. 9, the aperture 250 can be formed on a pellicle membrane 252 of the photomask 200. The pellicle membrane 252 is provided to prevent the surface of the transparent substrate 210, which has shielding patterns 212 and 214, from accumulating dust. The aperture 250 can be created by forming a shielding pattern 253 to define the square shaped opening H1 and the Fresnel lens shaped openings H2 on the surface of the pellicle membrane 252. The pellicle membrane 252 can be supported by the transparent substrate 210 using a frame 254. In this case, the thickness of the pellicle membrane 252 can be the deviation distance of a conventional wafer from the optimal focus. Accordingly, when the aperture 250 is formed using the pellicle membrane 252, a wafer can be located outside the optimal focus without moving the wafer.

A method of measuring lens aberration using a photomask 200 according to an embodiment of the present invention will now be described.

Figure 10:
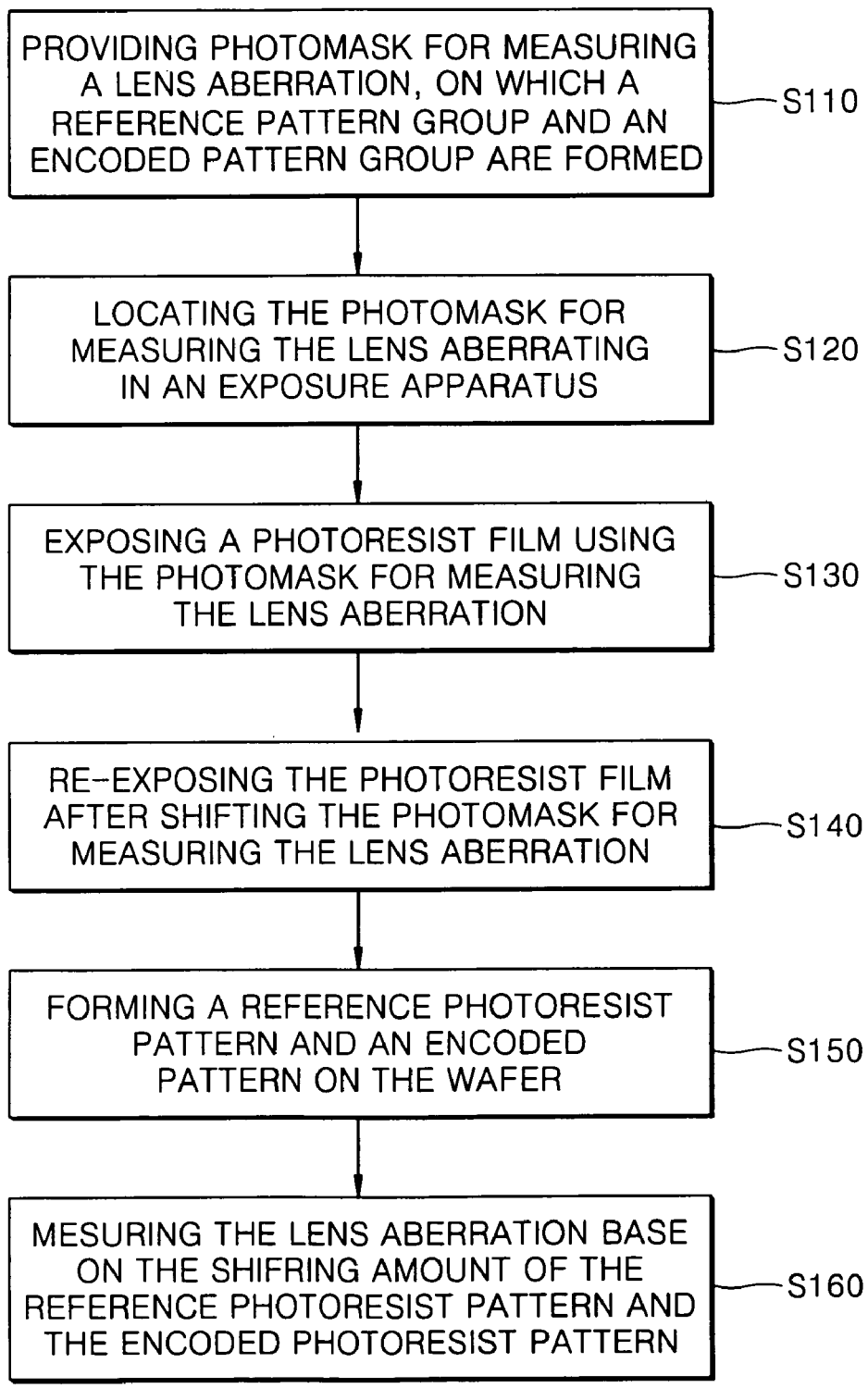
FIG. 10 is a flow chart for explaining a method of measuring lens aberration according to an embodiment of the present invention.
Figure 11:
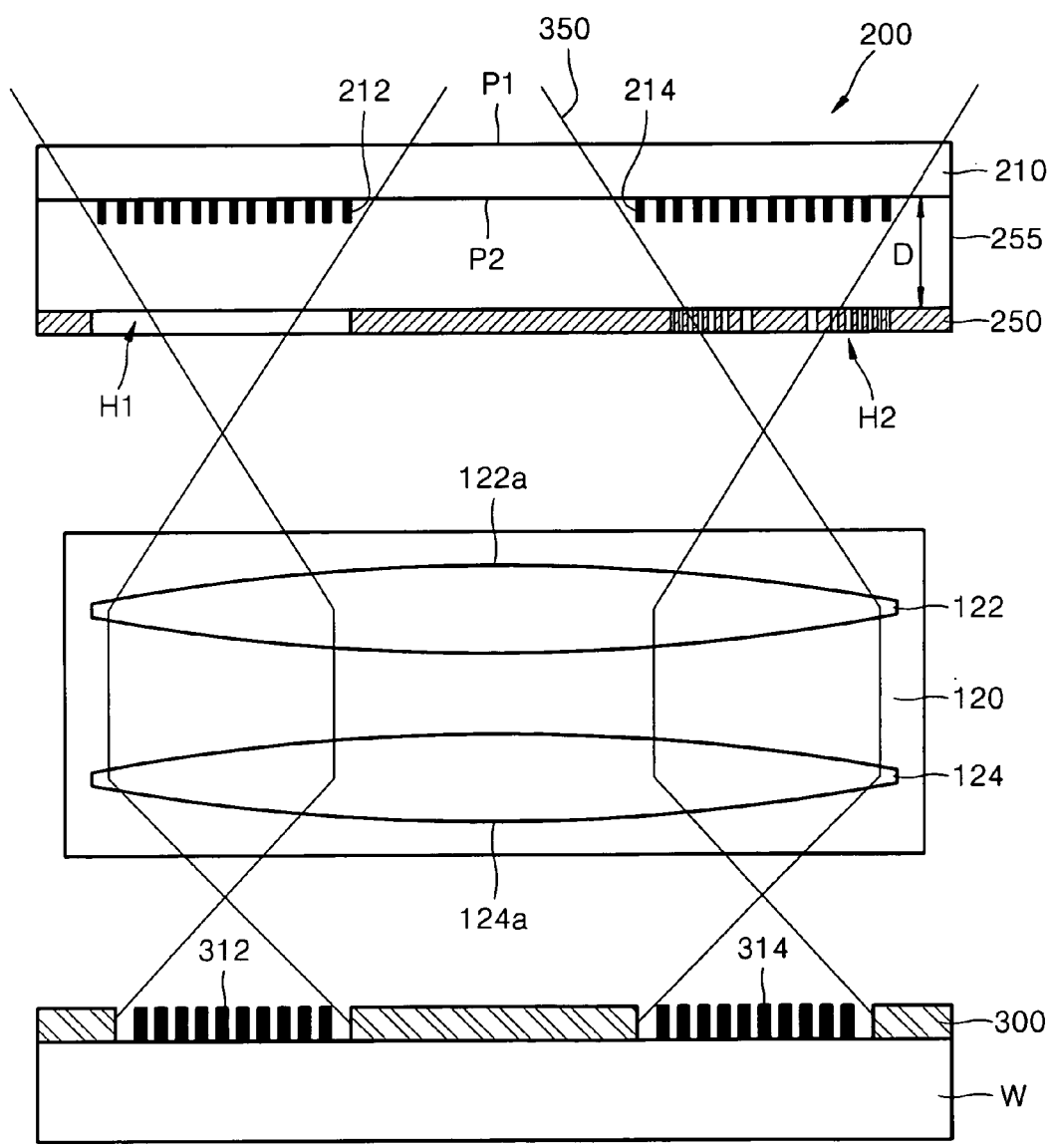
FIG. 11 is a cross-sectional view illustrating a configuration that transcribes a pattern on a photomask onto a wafer for measuring a lens aberration according to an embodiment of the present invention.

Referring to FIGS. 10 and 11, a photomask 200 for measuring lens aberration, on which a reference pattern group 212 and an encoded pattern group 214 are formed, is prepared (S110).

FIG. 11, being a schematic drawing, does not necessarily show how the light 350 propagates through the optical system 120. For example, FIG. 11 shows the light propagating through edge-ward areas of the lenses 122 and 124, not the center. But the two light paths of FIG. 11 merely show two processes in one drawing, wherein one process includes light 350 that may propagate through the center of the lenses 122 and 124 in the same location (but a different time) than the other process.

Next, the photomask 200 is located (S120) on a mask table 110 so that a first surface P1 of the transparent substrate 210 can face a light source 150 (see FIG. 2) of an exposure apparatus, and a second surface P2 of the transparent substrate 210 can face an optical system 120, which includes optical lenses 122 and 124.

A photoresist film 300 on a wafer W is exposed (S130) using the photomask 200 for measuring a lens aberration. At this time, light 350, incident at various angles from a light source, is made uniform by the micro lenses (ML)(not shown in the drawings) of the photomask 200, and then propagates to separated openings H1 and H2 of the aperture 250. The aperture 250 confines the incident angle of the light incident from various angles. The lenses 122 and 124 of the optical system 120 project images of the reference pattern group 212 and the encoded pattern group 214 to the photoresist film 300 using the incident light that is confined directionally.

Next, the wafer W is re-exposed (S140) after shifting the photomask 200. Preferably, the photomask 200 is shifted so that the photoresist film 300, on which an image of the reference pattern group 212 is transcribed, can overlap an image of the encoded pattern group 214 using the alignment marks 200.

Figure 12:
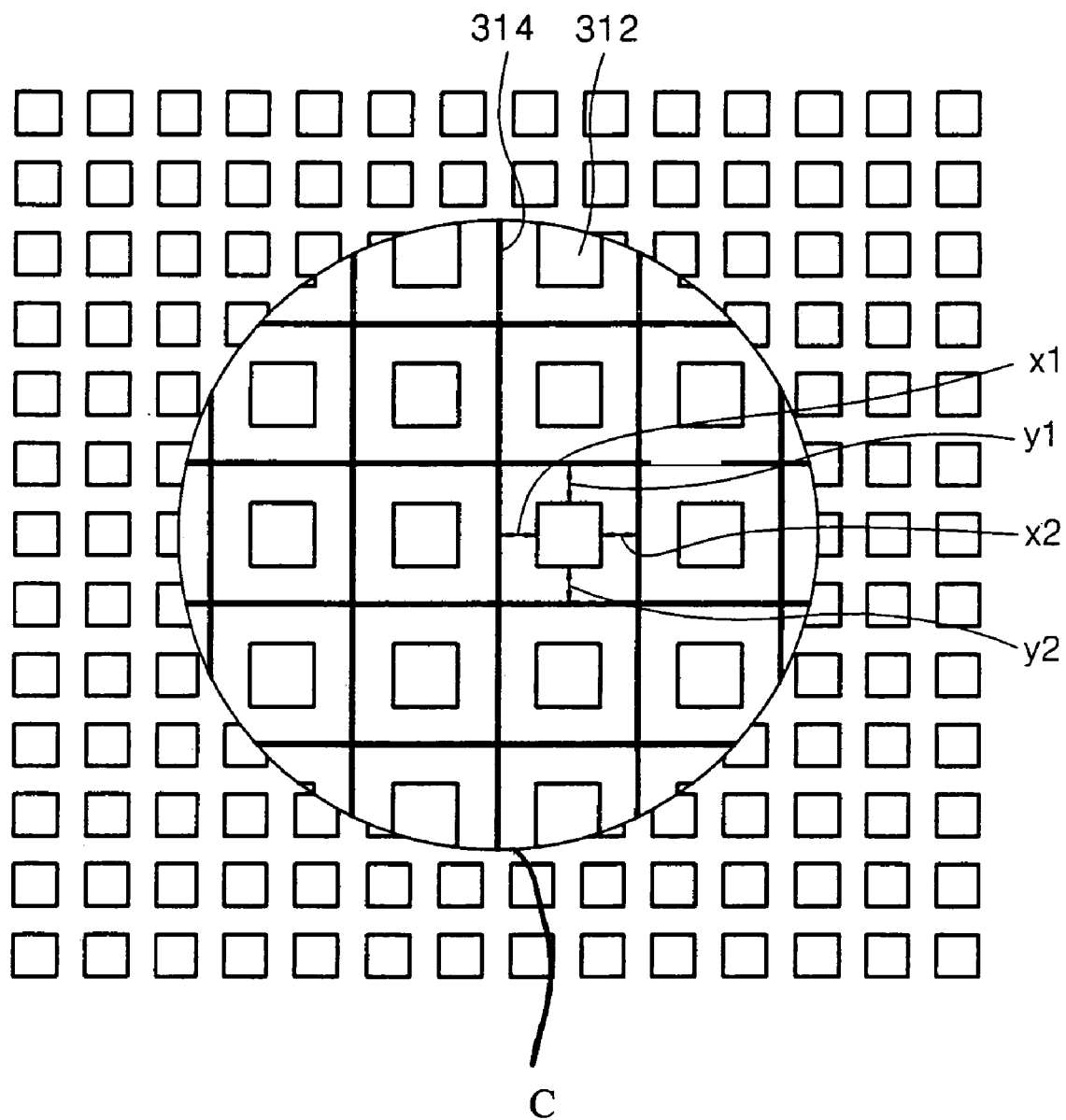
FIG. 12 is a plan view illustrating a wafer on which a reference photoresist pattern and an encoded photoresist pattern according to an embodiment of the present invention are formed.

After exposing the wafer W, a reference photoresist pattern 312 obtained from the reference pattern group 212, and an encoded photoresist pattern 314 obtained from the encoded pattern group 214, are formed (150) on the wafer W by developing photoresist patterns on the exposed wafer W. FIG. 12 is a plan view illustrating a wafer W on which a reference photoresist pattern 312 and an encoded photoresist pattern 314 are formed by developing photoresist patterns. In this manner, each of the encoded photoresist patterns 314 is formed to surround each of the reference photoresist patterns 312 by moving the photomask 200.

Also, in FIG. 12, a circle region C, in which the reference photoresist pattern 312 and the encoded photoresist pattern 314 are formed, is a region confined by the aperture 250, and the diameter 1 of the circle region C corresponds to the numerical aperture (NA) of the aperture 250.

Next, lens aberrations on pupil planes 122a and 124a in the optical system 120 are measured (S160) based on the amount of shifting of the reference photoresist pattern 312 and the encoded photoresist pattern 314. More specifically, the location of the reference photoresist pattern 312 is measured. Next, a shift f'x (x, y) in the x direction and a shift f'y (x, y) in the y direction of the encoded photoresist pattern 314 on the wafer W are measured, based on the location of the reference photoresist pattern 312 Then the shift of the encoded photoresist pattern 314 is calculated from these data. Afterward, a lens aberration function in the optical system 120 is obtained using computer software based on the shifts f'x (x, y) and f'y (x, y).

Although the embodiment described above discusses shifting the photomask 200 to expose different pattern groups 212 and 214, it should be noted that another embodiment may have the photomask 200 stationary while the wafer W and the optical system 120 are shifted, for example.

As described above, according to the present invention, a reference pattern and an encoded pattern for measuring lens aberration are formed on one photomask. Therefore, the time for replacing a photomask can be reduced and misalignment due to the replacement of the photomask can be prevented, since the photomask is moved horizontally without being replaced, when lens aberration is measured.

Light collecting capability can be improved by improving the light diffraction characteristics, by forming an aperture in a Fresnel lens shape. Therefore, the exposure energy efficiency is superior to a conventional pin hole type aperture.

Also, the aperture, according to some embodiments of the present invention, can measure lens aberration without moving a wafer from the optimal focus, since the aperture is formed in one body with a photomask by separating a predetermined distance from the transparent substrate.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A photomask for measuring lens aberration, comprising:
   a transparent substrate having a first surface and a second surface;
   a reference pattern group formed on the second surface of the transparent substrate;
   an encoded pattern group formed on the second surface of the transparent substrate and spaced apart from the reference pattern group; and
   an aperture to face the second surface of the transparent substrate and including ring shaped openings arranged as concentric circles.

2. The photomask of claim 1, wherein the reference pattern group is composed of square shaped shielding patterns arranged in a matrix.

3. The photomask of claim 2, wherein the encoded pattern group is a grid shaped shielding pattern that defines rectangular shaped regions, each having a size that can accommodate the reference pattern group shielding pattern.

4. The photomask of claim 2, wherein the encoded pattern group is a plurality of square shaped shielding patterns arranged in a matrix and has a reduced shape of the shielding patterns of the reference pattern group.

5. The photomask of claim 1, wherein the plurality of ring shaped openings of the aperture correspond to the encoded pattern group.

6. The photomask of claim 1, wherein the aperture further comprises an opening with a square shape that corresponds to the reference pattern group.

7. The photomask of claim 1, wherein the aperture is mechanically connected to the transparent substrate and is spaced apart from the second surface of the transparent substrate.

8. The photomask of claim 1, wherein the aperture includes:
   a pellicle membrane formed on the second surface of the transparent substrate; and
   a shielding pattern that defines the ring shaped openings and square shaped openings, formed on the surface of the pellicle membrane.

9. The photomask of claim 1 further comprising micro lenses arranged on the first surface of the transparent substrate.

10. The photomask of claim 1, wherein the reference pattern group and the encoded pattern group are spaced apart about 100 to about 900 µm.

11. The photomask of claim 1, wherein a plurality of alignment marks are formed on an edge of the second surface of the transparent substrate.

12. A photomask for measuring lens aberration, comprising:
   a transparent substrate having a first surface facing a light source and a second surface facing optical lenses of which the lens aberration will be measured;
   a reference pattern group formed on the second surface of the transparent substrate;
   an encoded pattern group formed on the second surface of the transparent substrate and spaced apart from the reference pattern group; and
   an aperture to face the second surface of the transparent substrate and including a square shape opening and a Fresnel zone opening,
   wherein the aperture is spaced apart from the second surface of the transparent substrate.

13. The photomask of claim 12 further comprising micro lenses arranged on the first surface of the transparent substrate.

14. The photomask of claim 12, wherein the reference pattern group is composed of square shaped shielding patterns arranged in a matrix.

15. The photomask of claim 14, wherein the encoded pattern group is a grid shaped shielding pattern that defines rectangular shaped regions, each having a size that can accommodate the reference pattern group shielding pattern.

16. The photomask of claim 14, wherein the encoded pattern group is a plurality of square shaped shielding patterns arranged in a matrix, and has a reduced shape of the shielding patterns of the reference pattern group.

17. The photomask of claim 12, wherein the square shape opening of the aperture, which corresponds to the reference pattern group, has a size that can accommodate the reference pattern group, and the Fresnel zone opening, which corresponds to the encoded pattern group, has a size that can accommodate the encoded pattern group.

18. The photomask of claim 12, wherein the aperture includes:
   a pellicle membrane formed on the second surface of the transparent substrate; and
   a shielding pattern that defines the first opening and the second opening, and is formed on the surface of the pellicle membrane.

19. The photomask of claim 12 further comprising micro lenses arranged on the first surface of the transparent substrate.

20. The photomask of claim 12, wherein the reference pattern group and the encoded pattern group are arranged alternately at a spacing of about 100 to about 900 µm.

21. The photomask of claim 12, wherein at least one alignment mark is formed on an edge of the second surface of the transparent substrate.

22. A method of manufacturing a photomask for measuring lens aberration, the method comprising:
   providing a transparent substrate having first and second surfaces;
   forming a shielding film on the second surface of the transparent substrate;
   forming a reference pattern group and an encoded pattern group on the second surface of the transparent substrate by patterning the shielding film; and
   forming an aperture that faces the second surface of the transparent substrate.

23. The method of claim 22, wherein the shielding film is a chromium film.

24. The method of claim 22, wherein forming the reference pattern group and the encoded pattern group comprises forming square patterns in a first region and a grid pattern to define rectangular shaped regions in a second region, which is spaced apart from the first region.

25. The method of claim 24 further comprising forming alignment marks on an edge of the second surface of the transparent substrate at the same time as forming the reference pattern group and the encoded pattern group.

26. A method of measuring lens aberration, comprising:
providing a photomask that includes a transparent substrate having a first surface and a second surface, a reference pattern group and an encoded pattern group spaced apart from each other on the second surface of the transparent substrate, and Fresnel lens shaped openings that face the second surface of the transparent substrate;
locating the photomask in an exposure apparatus so that the first surface of the transparent substrate faces a light source of the exposure apparatus and an aperture faces an optical lens of which the lens aberration will be measured;
placing the reference pattern group of the photomask in a first position;
forming a reference photoresist pattern by exposing a photoresist film on a wafer loaded in the exposure apparatus using the photomask;
shifting the photomask to locate the encoded pattern group at the first position;
forming an encoded photoresist pattern by exposing the photoresist film on the wafer using the shifted photomask; and
measuring the lens aberration on a pupil plane of the optical lens based on the distance between the reference photoresist pattern and the encoded photoresist pattern.

27. The method of claim 26, wherein measuring the lens aberration comprises:
measuring a shift $f_x(x, y)$ of the encoded photoresist pattern in an x direction on the wafer, based on the location of the reference photoresist pattern; and
measuring a shift $f_y(x, y)$ of the encoded photoresist pattern in a y direction on the wafer, based on a location of the reference photoresist pattern.

28. The method of claim 27, wherein measuring the lens aberration uses an aberration function of a pupil plane of the optical lens based on the shifts $f_x(x, y)$ and $f_y(x, y)$.

* * * * *

UNITED STATES PATENT AND TRADEMARK OFFICE
CERTIFICATE OF CORRECTION

PATENT NO. : 7,403,276 B2 Page 1 of 1
APPLICATION NO. : 11/388887
DATED : July 22, 2008
INVENTOR(S) : Jang-Ho Shin et al.

It is certified that error appears in the above-identified patent and that said Letters Patent is hereby corrected as shown below:

Column 6, line 41, the words "diameter 1" should read -- diameter l --;
Column 6, line 48, the word "f y (x, y)" should read -- fy (x, y) --.

Signed and Sealed this

Twenty-first Day of October, 2008

JON W. DUDAS
*Director of the United States Patent and Trademark Office*